United States Patent
Hossain et al.

(10) Patent No.: US 9,940,984 B1
(45) Date of Patent: Apr. 10, 2018

(54) SHARED COMMAND ADDRESS (C/A) BUS FOR MULTIPLE MEMORY CHANNELS

(71) Applicant: Intel Corporation, Santa Clara, CA (US)

(72) Inventors: MD Altaf Hossain, Portland, OR (US); Nagi Aboulenein, King City, OR (US); Jayapratap Bharathan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/278,802

(22) Filed: Sep. 28, 2016

(51) Int. Cl.
*G11C 7/10* (2006.01)
*G06F 13/16* (2006.01)
*G11C 8/18* (2006.01)

(52) U.S. Cl.
CPC ........ *G11C 7/1072* (2013.01); *G06F 13/1684* (2013.01); *G11C 7/1012* (2013.01); *G11C 8/18* (2013.01)

(58) Field of Classification Search
CPC ....... G11C 8/18; G11C 7/1072; G11C 7/1012; G06F 13/1684
See application file for complete search history.

(56) References Cited

U.S. PATENT DOCUMENTS

| | | | |
|---|---|---|---|
| 6,330,636 B1 | 12/2001 | Bondurant et al. | |
| 7,804,735 B2 * | 9/2010 | Mao | G06F 13/1684 365/230.03 |
| 8,307,190 B2 * | 11/2012 | Yamada | G06F 13/1668 711/103 |
| 8,325,525 B2 * | 12/2012 | Mao | G06F 13/1684 365/185.11 |
| 8,447,917 B2 * | 5/2013 | Chen | G06F 13/1684 711/103 |
| 8,683,096 B2 | 3/2014 | Hossain et al. | |
| 8,717,828 B2 * | 5/2014 | Kim | G11O 5/063 365/189.011 |
| 2003/0053176 A1 * | 3/2003 | Nishigaki | H04B 10/272 398/168 |
| 2006/0259666 A1 | 11/2006 | Lee | |
| 2008/0172500 A1 * | 7/2008 | Im | G06F 13/4234 710/26 |
| 2010/0138598 A1 | 6/2010 | LaBerge | |
| 2014/0181333 A1 | 6/2014 | Bains | |

FOREIGN PATENT DOCUMENTS

WO    2015164049 A1    10/2015

OTHER PUBLICATIONS

International Search Report and Written Opinion for PCT Patent Application No. PCT/US2017/047990, dated Nov. 30, 2017, 16 pages.

\* cited by examiner

*Primary Examiner* — Vanthu Nguyen
(74) *Attorney, Agent, or Firm* — Compass IP Law PC

(57) ABSTRACT

A shared command/address (C/A) bus for memory devices in a multi-channel configuration can enable reducing the number of pins and signal lines in a memory subsystem. In one embodiment, a memory controller includes hardware logic to generate commands to access a plurality of memory devices via a plurality of channels and input/output (I/O) circuitry to transmit command/address (C/A) information for the commands to the plurality of memory devices over a single C/A bus for the plurality of channels. In one embodiment, double-speed strobe signal lines can also enable reducing the number of pins and signal lines in a memory subsystem.

21 Claims, 10 Drawing Sheets

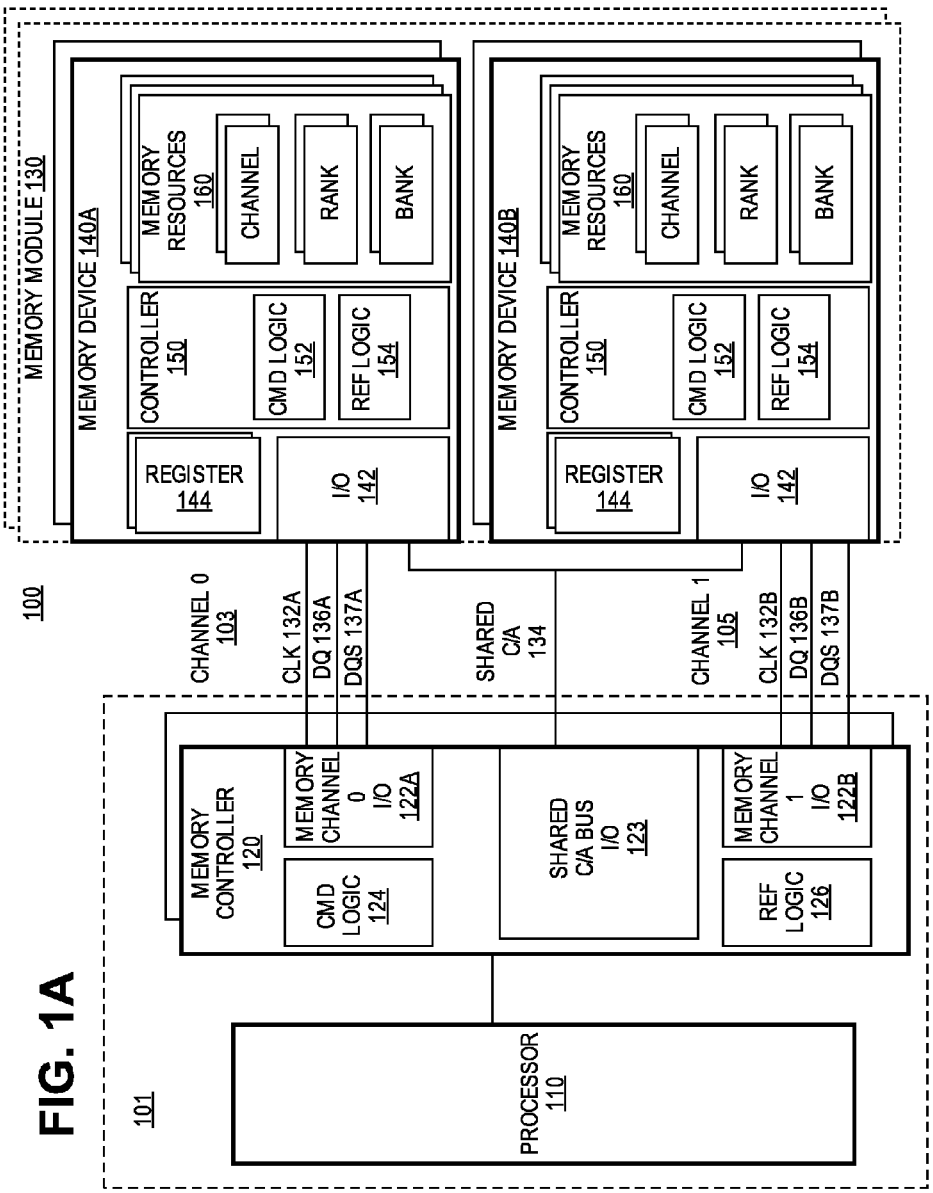

US 9,940,984 B1

SHARED COMMAND ADDRESS (C/A) BUS FOR MULTIPLE MEMORY CHANNELS

FIELD

The descriptions are generally related to memory device access, and more particularly to a shared command address bus for memory devices in multi-channel configurations.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, Intel Corporation, All Rights Reserved.

BACKGROUND

Memory controllers typically communicate with memory devices through a variety of signal lines, including clock signal lines, data signal lines, strobe signal lines, and command/address (C/A) signal lines. Some memory controllers support multiple channels for communicating with memory devices. For example, memory devices can be organized into different channels, wherein each channel is associated with an independent data bus and independent C/A bus. The memory controller can then access multiple memory devices in parallel by sending and receiving information over the independent data and C/A buses for multiple channels. Multiple independent channels can increase memory bandwidth. However, a higher number of channels leads to a higher number of pins and signals between the memory controller(s) and memory devices. A high pin and signal count can increase power consumption and lead to other issues such as crosstalk amongst signal lines.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 1A is a block diagram of a system with a shared command/address (C/A) bus for memory devices in a multi-channel configuration, in accordance with an embodiment.

Figure 1B:
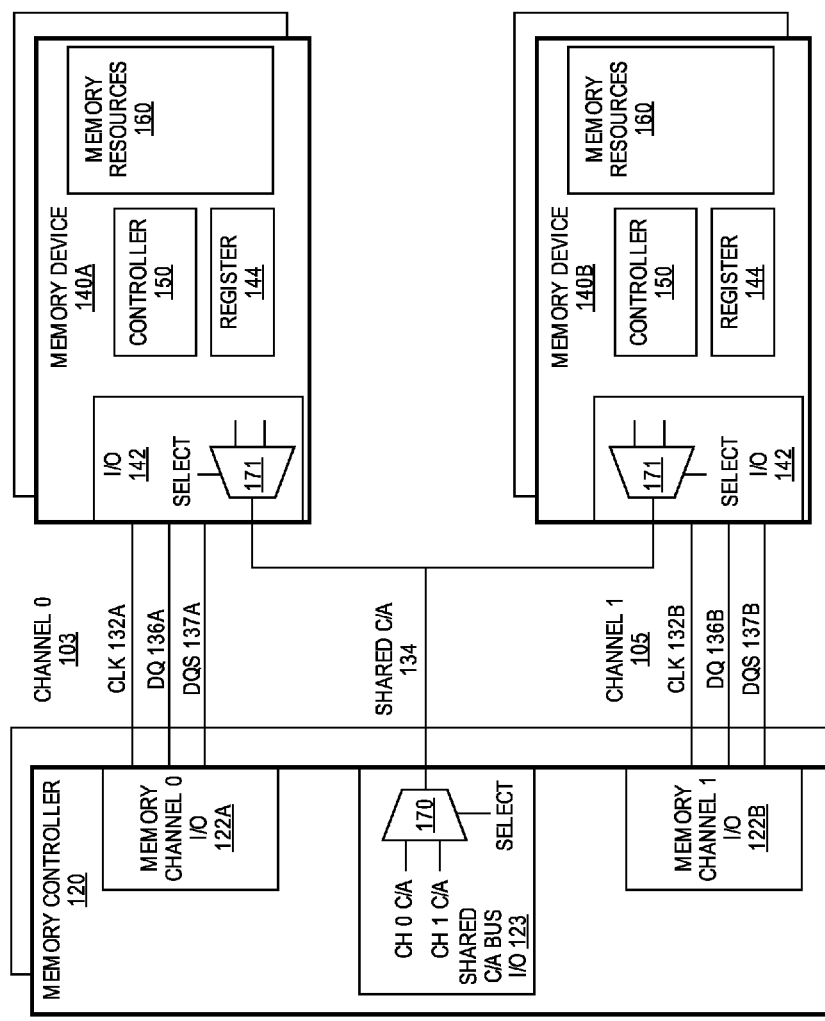
FIG. 1B is a block diagram illustrating the memory controller and memory devices of FIG. 1A, in accordance with an embodiment.

Descriptions of certain details and implementations follow, including a description of the figures, which may depict some or all of the embodiments described below, as well as discussing other potential embodiments or implementations of the inventive concepts presented herein.

DETAILED DESCRIPTION

A shared command/address (C/A) bus for multiple memory channels is described herein. Memory controllers communicate with memory devices over a variety of signal lines including clock signal lines, data signal lines, strobe signal lines, and command/address (C/A) signal lines. A bus includes a set of signal lines for transmitting information, such as data or control information. A command/address (C/A) bus includes a set of signal lines between a memory controller and one or more memory devices for transmitting command and address information from the memory controller to the memory devices.

Memory devices are often organized into multiple channels. In a conventional system, each channel is associated with an independent data bus and an independent C/A bus. For example, a 2-channel memory subsystem may have two independent data buses and two independent C/A buses coupling one or more memory controllers to two groups of memory devices. Independent buses typically refer to buses that can be separately controlled for signaling and timing. The memory controller can then access the memory devices on the first channel using the data and C/A buses for the first channel and access the memory devices on the second channel using the data and C/A buses for the second channel. The multiple channels therefore enable the memory controller to send and receive information over the independent data and C/A buses for multiple channels in parallel. Thus, multiple channels can increase memory bandwidth. However, the increase in bandwidth comes at the cost of a greater number of pins and signal lines. Increasing the number of pins and signal lines typically results in occupying more space on the motherboard and package, which can result in an increase in power consumption, and can increase the complexity of layout due to the potential for cross-talk amongst signal lines.

In contrast, embodiments include a single shared command/address (C/A) bus for multiple memory channels. For example, in a system with two channels, a single physical C/A bus couples the memory controller with memory devices on the two channels, and the memory controller sends command and address information to the memory devices over the single C/A bus for both channels. In one embodiment, the memory controller sends the C/A information for multiple channels by time multiplexing the C/A information onto the shared C/A bus. Therefore, in accordance with an embodiment, the pins and signal lines associated with one or more of the C/A buses in a conventional system can be eliminated, which can save power and space on the silicon and package. In one embodiment, a shared C/A bus can also enable reduction of board layer count and ease silicon, package, and board routing due to fewer signal lines. In one embodiment, the shared C/A bus can also run at double data rate (e.g., the memory controller can send C/A information on both the rising and falling edges), which can cancel out the potentially negative performance impact of multiple channels sharing a common C/A bus. In one embodiment, pins and signal lines for strobe signals can also be reduced by running the strobe signal lines at double the speed of the data signal lines and using one strobe pair for two bytes of data on the data signal lines instead of one byte of data on the signal lines.

FIG. 1A is a block diagram of a system with a shared command/address (C/A) bus for multiple channels, in accordance with an embodiment. System 100 includes elements of a memory subsystem in a computing device. Processor 110 represents a processing unit of a host computing platform that executes an operating system (OS) and applications, which can collectively be referred to as a "host" for the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. System 100 can be implemented as an SOC (system on a chip), or be implemented with standalone components.

Memory controller 120 represents one or more memory controller circuits or devices for system 100. Memory controller 120 represents control logic that generates memory access commands in response to the execution of operations by processor 110. Memory controller 120 accesses one or more memory devices 140A and 140B. Reference to memory devices can apply to different memory types. In one embodiment, the memory devices 140A, 140B include volatile memory devices. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), or others or combinations of memory technologies, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. "DRAM" refers to dynamic RAM, and is volatile. The memory device or DRAM can refer to the die itself, to a packaged memory product that includes one or more dies, or both.

The memory controller 120 and the memory devices 140A, 140B are coupled via a system bus. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data. The system bus includes at least a clock signal (CLK) (e.g., clock signals 132A and 132B), shared command/address (CMD) bus 134, read data DQ (e.g., read data 136A and 136B), and data strobe signals (e.g., DQS 137A and 137B). In one embodiment, a bus or connection between memory controller 120 and memory can be referred to as a memory bus. The signal lines for CMD can be referred to as a "C/A bus" (or ADD/CMD bus, or some other designation indicating the transfer of commands and address information) and the signal lines for write and read DQ can be referred to as a "data bus." System 100 can be considered to have multiple "system buses," in the sense that an independent interface path can be considered a separate system bus. It will be understood that in addition to the lines explicitly shown, a system bus can include strobe signaling lines, alert lines, auxiliary lines, and other signal lines.

In one embodiment, memory devices 140A, 140B are organized and managed as different channels. FIG. 1A illustrates two channels 103 and 105, labeled channel 0 and channel 1, respectively. However, other embodiments can be organized into other numbers of channels (e.g., 1, 8, 16, or other numbers of channels). In the embodiment illustrated in FIG. 1A, each channel has a data bus (DQ 136A for channel 0 and DQ 136B for channel 1), data strobe lines (DQS 137A for channel 0 and 137B for channel 1), and clock signal lines (CLK 132A for channel 0 and CLK 132B for channel 1). The data buses and data strobe signals for each channel are separate and independently operable in the sense that separate commands (e.g., read and write commands) can be transmitted over the data buses 136A, 136B for the different channels simultaneously. Thus, in one embodiment, the memory controller 120 can handle independent data transfers over the data buses 136A, 136B for the different channels. However, in accordance with an embodiment, the channels share a clock and C/A bus, and thus are not independent in terms of timing.

Unlike conventional systems that include an independent C/A bus for each channel, the embodiment illustrated in FIG. 1A includes a shared C/A bus 134 for both channel 0 and channel 1. The shared C/A bus 134 couples the memory controller 120 to memory devices 140A on channel 0 and memory devices 140B on channel 1. Thus, the memory controller 120 transfers command and address information over the shared C/A bus 134 for both channel 0 and channel 1 by, for example, multiplexing the information onto the C/A bus for both channels. In one such embodiment, the channels 103, 105 also share a clock (clock signals 132A, 132B). Thus, as mentioned above, although the data buses are independent in terms of the data that is transferred over the data buses, the data buses are not independent in terms of timing. Other embodiments can include other configurations for data buses and clock signals for accessing the memory devices other than the configuration illustrated in FIG. 1A.

In one embodiment, the memory controller 120 includes circuitry (shared C/A bus Input/Output (I/O) circuitry 123) to transmit command and address information for both channels over the shared C/A bus 134. In one embodiment, the shared C/A bus I/O circuitry 123 includes a multiplexer to multiplex the command and address information for channel 0 and channel 1 onto the shared C/A bus 134. FIG. 1B, which is described below, illustrates an example of a memory controller with I/O circuitry 123 that includes a multiplexer to multiplex C/A information for multiple channels onto a shared C/A bus. In one such embodiment, the memory controller 120 is configured to transmit and receive data over the data buses 136A, 136B in accordance with the timing of command and address information transmitted over the shared C/A bus 134. For example, the memory controller 120 can offset the data for one of the channels to correspond with the edge (e.g., rising or falling) on which the memory controller is transmitting C/A information for the channel. In one such example, the data on the data bus 136A for channel 0 can be offset from the data on the data bus 136B for channel 1 by one command UI (unit interval) (where one command unit interval is the time between two edges of a clock signal that are used for transmitting a command).

The shared C/A bus 134 is configured to operate at a bandwidth. In one embodiment, the command and write signal lines can include unidirectional lines for write and command data from the host to memory. Similarly, read DQ 136A, 136B can include unidirectional lines for read data from the memory to the host. In one embodiment, the data bus can include bidirectional lines for read data and for write/command data. Based on design of system 100, or implementation if a design supports multiple implementations, the data bus can have more or less bandwidth per memory device 140A, 140B. For example, the data bus can support memory devices that have either a x128 interface, a x64 interface, a x32 interface, a x16 interface, a x8 interface, or other interface. The convention "xW," where W is a binary integer refers to an interface size of memory device 140A, 140B, which represents a number of signal lines to exchange data with memory controller 120. The interface size of the memory devices is a controlling factor on how many memory devices can be used concurrently per channel in system 100 or coupled in parallel to the same signal lines. In one embodiment, high bandwidth memory devices, wide interface devices, or stacked memory configurations, or combinations, can enable wider interfaces, such as a x128 interface, a x256 interface, a x512 interface, a x1024 interface, or other interface width.

In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110 (as illustrated by box 101), such as logic implemented on the same die or implemented in the same package space as the processor.

Memory controller 120 includes I/O interface circuitry 122A, 122B for each channel to couple to a system bus or a memory bus or both. I/O interface circuitry 122A, 122B (as well as I/O interface circuitry 142 of memory devices 140A, 140B) can include pins, pads, connectors, signal lines, traces, or wires, solder bumps, vias, or other hardware to connect the devices, or a combination of these. I/O interface circuitry 122A, 122B can include a hardware interface. Commonly, wires within an integrated circuit interface couple with a pad, pin, or connector to interface signal lines or traces or other wires between devices. According to embodiments, I/O interface logic 122A, 122B can include drivers, receivers, transceivers, or termination, or other circuitry or combinations of circuitry to exchange signals on the signal lines between the devices. The exchange of signals includes at least one of transmit or receive. While shown as coupling I/O circuitry 122A from memory controller 120 to I/O circuitry 142 of memory device 140A and I/O circuitry 122B from memory controller 120 to I/O circuitry 142 of memory device 140B, it will be understood that in an implementation of system 100 where groups of memory devices are accessed in parallel, multiple memory devices can include I/O interfaces to the same interface of memory controller 120. In an implementation of system 100 including one or more memory modules 130, I/O circuitry 142 can include interface hardware of the memory module in addition to interface hardware on the memory device itself. Other memory controllers 120 will include separate interfaces to other memory devices.

Referring again to the I/O circuitry 123 for the shared C/A bus, like I/O circuitry 122A, 122B mentioned above, the I/O circuitry 123 for the shared C/A bus can also include a variety of hardware to connect devices. Examples of hardware included in I/O circuitry 123 include: pins, pads, connectors, signal lines, traces, or wires, solder bumps, vias, or other hardware to connect the devices, or a combination of these. Conventional memory controllers typically have pins and signal lines for a C/A bus for each channel. For example, for a memory subsystem compatible with DDR3 (double data rate version 3) and configured to have two channels, a conventional memory controller would include 48 input/output pins for the C/A bus (for each channel, 24 I/O pins including: A[9-0], A10/AP, A11, A12/BC, A[15:13], BA[2:0], CKE[1:0], RAS#, CAS#, and WE#). In contrast, in one embodiment, a shared C/A bus is used for multiple channels. Therefore, in the example above for a memory subsystem compatible with JEDEC DDR3 and configured to have two channels, the memory controller would include 24 I/O pins for the shared C/A bus (e.g., one set of the following signals for two channels: A[9-0], A10/AP, A11, A12/BC, A[15:13], BA[2:0], CKE[1:0], RAS#, CAS#, WE#). In one embodiment, the shared C/A bus includes an additional channel select signal (e.g., a CS or CS# signal or bit(s)). The channel select signal can include one or more bits to identify which channel the command and address information on the shared C/A bus 134 is for at a given time. In accordance with an embodiment, multiple pins (e.g., 24 I/O pins for every 2 channels) can be eliminated, reducing the number of pins used for the C/A bus. Furthermore, the signal lines coupling the memory controller and the memory devices could also be reduced (e.g., one set of signal lines for two channels instead of two sets of signal lines). Accordingly, embodiments enable fewer pins and signal lines, which can reduce the silicon and package area used for the C/A bus, and can also reduce power consumption.

Memory devices 140A, 140B represent memory resources for system 100. In one embodiment, each memory device 140A, 140B is a separate memory die. In one embodiment, each memory device 140A, 140B can interface with a single or multiple (e.g., 2) channels per device or die. Each memory device 140A, 140B includes I/O interface logic 142, which has a bandwidth determined by the configuration of the device (e.g., x128, x64, x32, x16 or x8 or some other data bus width). I/O interface circuitry 142 enables the memory devices to interface with memory controller 120. I/O interface circuitry 142 can include a hardware interface, and can be in accordance with I/O circuitry 122A, 122B, and 123 of memory controller, but at the memory device end.

In some embodiments, the memory devices include features to enable the memory devices to receive command and address information from the shared C/A bus. For example, memory devices can be configured to receive command and address information from the shared C/A bus on either the rising or falling edge of the clock. In one such embodiment, the memory device includes a register setting (e.g., registers 144) to indicate whether a given memory device receives C/A information on the rising or falling edge of the clock. In another embodiment, the memory devices can be configured to either receive C/A information on the rising edge or on the falling edge. In one embodiment, the I/O interface circuitry 142 includes a demultiplexer to demultiplex the C/A information received over the shared C/A bus 134, and extract the C/A information for the channel on which the memory device is configured to be on. FIG. 1B illustrates an example of memory devices that include demultiplexers to extract C/A information from the common C/A bus. In one embodiment, multiple memory devices 140A, 140B are connected in parallel to the same data buses. For example, system 100 can be configured with multiple memory devices coupled in parallel, with each memory device responding to a command, and accessing memory resources 160 internal to each. For a Write operation, an individual memory device can write a portion of the overall data word, and for a Read operation, an individual memory device can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one embodiment, memory devices 140A, 140B are disposed directly on a motherboard or host system platform (e.g., a PCB (printed circuit board) on which processor 110 is disposed) of a computing device. In one embodiment, memory devices 140A, 140B can be organized into memory modules 130. In one embodiment, memory modules 130 represent dual inline memory modules (DIMMs). In one embodiment, memory modules 130 represent other organization of multiple memory devices to share at least a portion of access or control circuitry, which can be a separate circuit, a separate device, or a separate board from the host system platform. Memory modules 130 can include multiple memory devices 140A, 140B, and the memory modules can include support for multiple separate channels to the included memory devices disposed on them. In another embodiment, memory devices 140A, 140B may be incorporated into the same package as memory controller 120, such as by techniques such as multi-chip-module (MCM), package-on-package, through-silicon VIA (TSV), or other techniques or combinations. Similarly, in one embodiment, multiple memory devices 140A, 140B may be incorporated into memory modules 130, which themselves may be incorporated into the same package as memory controller 120. It will be appreciated that for these and other embodiments, memory controller 120 may be part of host processor 110.

Memory devices 140A, 140B each include memory resources 160. Memory resources 160 represent individual arrays of memory locations or storage locations for data. Typically, memory resources 160 are managed as rows of data, accessed via wordline (rows) and bitline (individual bits within a row) control. Memory resources 160 can be organized as separate channels, ranks, and banks of memory. Channels are independent control paths to storage locations within memory devices 140A, 140B. Ranks refer to common locations across multiple memory devices (e.g., same row addresses within different devices). Banks refer to arrays of memory locations within a memory device 140A, 140B. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140A, 140B include one or more registers 144. Register 144 represents one or more storage devices or storage locations that provide configuration or settings for the operation of the memory device. In one embodiment, register 144 can provide a storage location for memory device 140A, 140B to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140A, 140B to operate in different "mode," where command information can trigger different operations within memory devices 140A, 140B based on the mode. Additionally or in the alternative, different modes can also trigger different operation from address information or other signal lines depending on the mode. Settings of register 144 can indicate configuration for I/O settings (e.g., shared C/A bus settings, timing, termination or ODT (on-die termination), driver configuration, or other I/O settings).

In one embodiment, memory devices 140A, 140B includes ODT as part of the interface hardware associated with I/O 142. ODT can be configured as mentioned above, and provide settings for impedance to be applied to the interface to specified signal lines. In one embodiment, ODT is applied to DQ signal lines. In one embodiment, ODT is applied to the signal lines of the shared C/A bus 134. In one embodiment, ODT can be applied to any combination of the preceding. The ODT settings can be changed based on whether a memory device is a selected target of an access operation or a non-target device. ODT settings can affect the timing and reflections of signaling on the terminated lines. Careful control over ODT can enable higher-speed operation with improved matching of applied impedance and loading. ODT can be applied to specific signal lines of I/O interfaces (e.g., interface 142, 122A; interface 142, 122B; and interface 142, 123), and is not necessarily applied to all signal lines.

Memory devices 140A, 140B includes controller 150, which represents control logic within the memory device to control internal operations within the memory device. For example, controller 150 decodes commands sent by memory controller 120 and generates internal operations to execute or satisfy the commands. Controller 150 can be referred to as an internal controller. Controller 150 can determine what mode is selected based on register 144, and configure the internal execution of operations for access to memory resources 160 or other operations based on the selected mode. Controller 150 generates control signals to control the routing of bits within memory device 140A, 140B to provide a proper interface for the selected mode and direct a command to the proper memory locations or addresses.

Referring again to memory controller 120, memory controller 120 includes command (CMD) logic 124, which represents logic or circuitry to generate commands to send to memory devices 140A, 140B. Typically, the signaling in memory subsystems includes address information within or accompanying the command to indicate or select one or more memory locations where the memory devices should execute the command. In one embodiment, controller 150 of memory device 140A, 140B includes command logic 152 to receive and decode command and address information received via I/O 142 from memory controller 120. Based on the received command and address information, controller 150 can control the timing of operations of the logic and circuitry within memory devices 140A, 140B to execute the commands. Controller 150 is responsible for compliance with standards or specifications within memory devices 140A, 140B, such as timing and signaling requirements. Memory controller 120 can also ensure compliance with standards or specifications by access scheduling and control.

In one embodiment, memory controller 120 includes refresh (REF) logic 126. Refresh logic 126 can be used where memory devices 140A, 140B are volatile and need to be refreshed to maintain a deterministic state. In one embodiment, refresh logic 126 indicates a location for refresh, and a type of refresh to perform. Refresh logic 126 can trigger self-refresh within memory devices 140A, 140B, and issue external refreshes by sending refresh commands to trigger the execution of a refresh operation. For example, in one embodiment, system 100 supports all bank refreshes as well as per bank refreshes, or other all bank and per bank commands. All bank commands cause an operation of banks within all memory devices 140A, 140B coupled in parallel. Per bank commands cause the operation of a specified bank within a specified memory device. In one embodiment, controller 150 within memory devices 140A, 140B includes refresh logic 154 to apply refresh within memory devices 140A, 140B. In one embodiment, refresh logic 154 generates internal operations to perform refresh in accordance with an external refresh received from memory controller 120. Refresh logic 154 can determine if a refresh is directed to a memory device, and what memory resources 160 to refresh in response to the command. For self-refresh, refresh logic 154 controls the timing and execution of refresh in response to entry into a low power mode and self-refresh based on a command from memory controller 120.

Thus, a memory subsystem can implement a shared C/A bus, which can result in a reduction of signal lines and pins. As mentioned above, a shared C/A bus can result in a decrease in performance. For example, a shared C/A bus can become a bottleneck in a system due to the number of loads (e.g., devices) on the shared C/A bus in comparison to the data bus. In one such embodiment, the performance impact of a shared C/A bus can be less of an issue for mobile devices with wider data interfaces (e.g., x32, x64, x128 interfaces or wider interfaces) and POP (package on package) memory packages (e.g., due to the proximity of components in such packages). In another embodiment, a memory subsystem can include a greater number of devices (e.g., 2, 4, or 8 memory devices) coupled with the memory controller via multiple (e.g., 2) channels can include a shared C/A bus.

FIG. 1B is a block diagram illustrating the memory controller 120 and memory devices 140A, 140B of FIG. 1A, in accordance with an embodiment. As mentioned above, in one embodiment, the shared C/A bus I/O circuitry 123 includes a multiplexer 170 to multiplex the command and address information for channel 0 and channel 1 over the shared C/A bus 134. Although a single multiplexer is illustrated, in accordance with an embodiment, the I/O circuitry 123 includes a multiplexer for each signal line of the C/A bus 134. In one embodiment, the shared C/A bus I/O circuitry 123 includes a multiplexer 170 to receive command and address information for multiple channels (e.g., channel 0 and channel 1 as illustrated in FIGS. 1A and 1B) and output the command and address information for one of the channels at a given time onto the shared C/A bus 134.

In one embodiment, the shared C/A bus I/O circuitry 123 performs time multiplexing to transmit the command and address information for both channels 103, 105. Time multiplexing involves transmitting the command and address information for the two channels 103, 105 at different times on the shared C/A bus 134. In one such embodiment, the command and address information for one channel is transmitted on a rising clock edge and the command and address information for another channel is transmitted on a falling clock edge. In one such embodiment, the clock signal can be input as the select signal of the multiplexer 170. In another embodiment, a separate channel select signal (e.g., a channel select bit, which can be added to the shared C/A bus) is input as the select signal of the multiplexer 170. As mentioned above, the channel select signal can include one or more bits to identify which channel the command and address information on the shared C/A bus 134 is for at a given time. In one embodiment, the memory controller 120 is configured to transmit and receive data over the data buses 136A, 136B in accordance with the timing of command and address information transmitted over the shared C/A bus 134. For example, the memory controller 120 can offset the data for one of the channels to correspond with the edge (e.g., rising or falling) on which the memory controller is transmitting C/A information for the channel. In one such example, the data on the data bus 136A for channel 0 can be offset from the data on the data bus 136B for channel 1 by one command UI (unit interval) (where one command unit interval is the time between two edges of a clock signal that are used for transmitting a command).

In one embodiment, the memory devices 140A, 140B include I/O circuitry to receive signals transmitted by the memory controller 120. For example, in one embodiment, the memory devices include features to enable the memory devices to receive command and address information from the shared C/A bus. In one such example, memory devices can be configured to receive command and address information from the shared C/A bus on either the rising or falling edge of the clock. The memory devices can include a register setting (e.g., registers 140) to indicate whether a given memory device receives C/A information on the rising or falling edge of the clock. In one embodiment, the memory devices can be configured to either receive C/A information on the rising edge or on the falling edge. In accordance with one embodiment, the I/O interface circuitry 142 includes a demultiplexer 171 to demultiplex the C/A information received over the shared C/A bus 134, and extract the C/A information for the channel on which the memory device is configured to be on. Although a single demultiplexer is illustrated, in accordance with an embodiment, the I/O circuitry 142 includes a demultiplexer for each signal line of the C/A bus 134. Thus, in one embodiment, each signal line of the multi-signal line C/A bus 134 is associated with a corresponding multiplexer and demultiplexer. In one embodiment, a select signal (e.g., the clock signal 132A or 132B, or another select signal such as the channel select signal described above) are input into the demultiplexer 171 to extract the command and address information for the relevant channel. For example, in an embodiment in which the C/A information for one channel is transferred on a rising clock edge, and C/A information for another channel is transferred on a falling clock edge, the clock signal can be used as the select signal input to the demultiplexer 171. In another embodiment, a channel select signal that includes one or more bits of the shared C/A bus can be used as the select signal input to the demultiplexer 171. Thus, in one embodiment, the I/O circuitry 142 extracts the C/A information from the shared C/A bus for the channel on which the memory device is on. Although FIG. 1B illustrates the demultiplexer 171 as being located on the memory device, other embodiments can include demultiplexers separate from the memory device. For example, in one embodiment, the demultiplexers for demultiplexing C/A information from the shared C/A bus are located on the memory module 130, and coupled with the I/O circuitry 142 on the memory devices.

Thus, in accordance with an embodiment, the pins and signal lines associated with one or more of the C/A buses in a conventional system can be eliminated, which can save power and enable smaller form factors. For example, a shared C/A bus can enable power reduction compared to a conventional memory system when both sets of C/A lines are not being used simultaneously. Note that FIG. 1A illustrates one embodiment of a memory subsystem with a shared C/A bus, but other configurations are possible. For example, embodiments can include more than two channels, and each channel can couple with one or more memory devices. In some embodiments, multiple channels couple with single memory device. In some embodiments, a shared C/A bus couples the memory controller with memory devices on more than two channels (e.g., 4 channels).

Figure 2A:
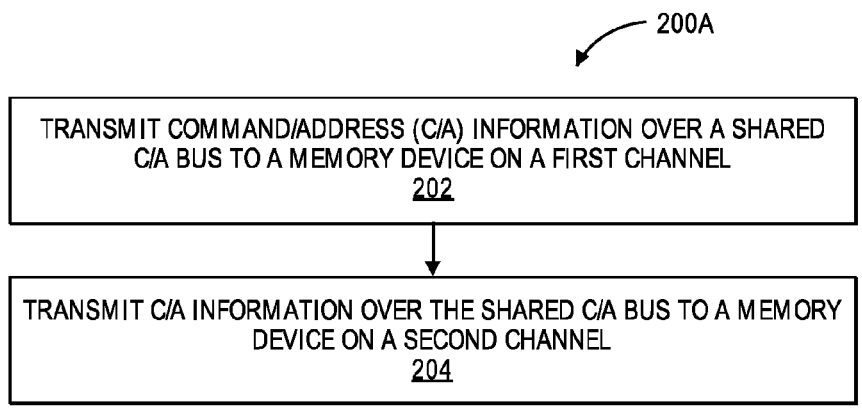
FIGS. 2A and 2B are flow diagrams of methods of accessing memory devices over a shared C/A bus, in accordance with embodiments.
Figure 2B:
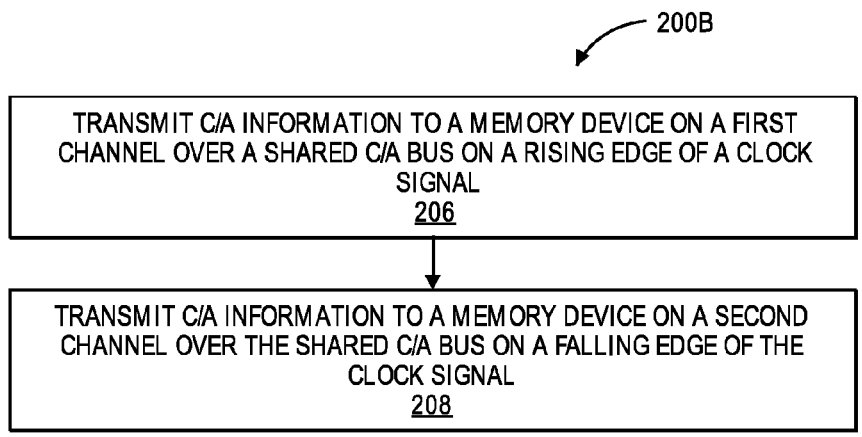

FIGS. 2A and 2B are flow diagrams of methods of accessing memory devices over a shared C/A bus, in accordance with embodiments. The methods 200A and 200B of FIGS. 2A and 2B can be performed by one or more memory controllers, such as the memory controller 120 of FIGS. 1A and 1B.

The method 200A of FIG. 2A begins with a memory controller transmitting C/A information over a shared C/A bus to a memory device on a first channel, at operation 202. For example, referring to FIG. 1A, the memory controller 120 transmits command or address information over the shared C/A bus 134 to memory device 140A, which is on channel 0.

The memory device also transmits C/A information over the shared bus to a memory device on a second channel, at operation 204. For example, referring to FIG. 1A, the memory controller 120 transmits command or address information over the same shared C/A bus 134 to a memory device 140B, which is on channel 1. Thus, unlike conventional systems which have independent C/A buses for each memory channel, in accordance with embodiments, a memory controller sends C/A information for memory devices on multiple channels over the same shared C/A bus.

The method 200B of FIG. 2B is also a method of accessing memory devices over a shared C/A bus, in accordance with embodiments. The method 200B is an example of a method of accessing memory devices over a shared C/A bus using time multiplexing. The method 200B begins with a memory controller transmitting C/A information to a memory device on a first channel over a shared C/A bus on a rising edge of a clock signal, at operation 206. For example, referring to FIG. 1B, the memory controller 120 transmits command or address information to memory device 140A, which is on channel 0, over the shared C/A bus on a rising edge of the clock signal 132A.

The memory controller also transmits C/A information to a memory device on a second channel over the shared C/A bus on a falling edge of the clock signal, at operation 208. For example, referring to FIG. 1B, the memory controller 120 transmits command or address information to the memory device 140B, which is on channel 1, over the same shared C/A bus on a falling edge of the clock signal 132B. In one embodiment, a multiplexer in the memory controller (e.g., the multiplexer 170 of FIG. 1B) time multiplexes the control and address information for multiple channels (e.g., based on the clock signal as the input to the select signal of the multiplexer). Thus, the memory controller transmits information over the C/A bus on both the rising and falling edges of the clock signal to which the C/A bus is synchronized, in accordance with an embodiment.

Conventional memory subsystems typically do not transfer C/A information on both the rising and falling edges of the clock. For example, memory technologies such as DDR3 typically run the C/A bus at half the frequency of the data bus. Conventional memory technologies do not transfer C/A information on both the rising and falling edges of the clock because, for example, the interference between signal lines of the C/A bus at high frequencies degrades the signals and can necessitate greater setup and hold times. However, in accordance with embodiments, a shared C/A bus has fewer signal lines, which can decrease interference between signal lines and results in a higher quality signal. The reduction in interference can therefore enable running the C/A bus at double speed (e.g., transferring C/A information on both the rising and falling edges of the clock signal). As an example, if the clock speed is 1600 MHz, the clock UI (unit interval), which is the time between two edges of the clock signal, would be 625 picoseconds (ps). In a conventional system, the command UI would be twice the clock UI. Thus, in the above example, the command UI would be 1250 ps in a conventional system. However, in an embodiment with a shared C/A bus running at double speed, the command UI is the same as the clock UI (in the above example, 625 ps). Accordingly, the shared C/A bus can be run at double speed, which can reduce or cancel out performance decreases resulting from having a shared C/A bus for multiple channels.

As discussed above with respect to FIG. 1B, the I/O circuitry on the memory devices can include circuitry to extract the relevant command and address information for a given device. For example, memory devices can include demultiplexers to perform the reverse method described above to extract the command and address information for a given memory device from the time-multiplexed C/A bus. Other embodiments can include other techniques for time multiplexing the command and address information onto the shared C/A bus. For example, in some embodiments, the memory controller transmits command and address information for different channels at alternating times on either the rising or falling edges of the clock signal, but not both.

Figure 3:
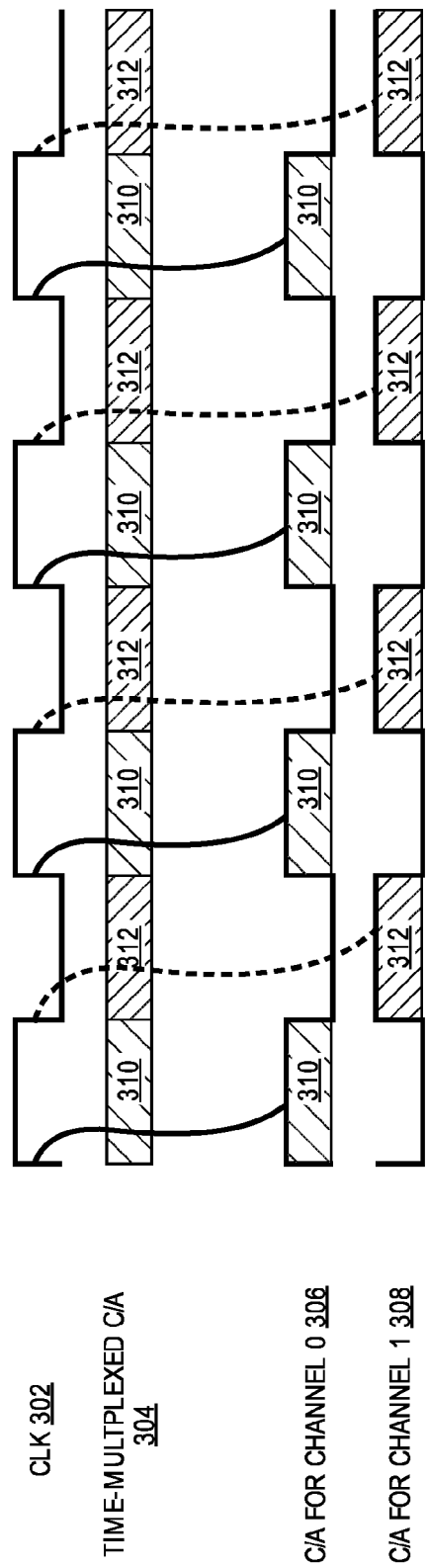
FIG. 3 is a timing diagram illustrating time multiplexing to transmit command and address information over a shared C/A bus for multiple channels, in accordance with an embodiment.

FIG. 3 is a timing diagram illustrating time multiplexing to transmit command and address information over a shared C/A bus for multiple channels, in accordance with an embodiment. The timing diagram of FIG. 3 includes a clock signal 302 and time-multiplexed command and address information 304 that is synchronized with the clock signal 302. In one embodiment implementing a time-multiplexed C/A bus, the memory controller (e.g., memory controller 120 of FIGS. 1A and 1B) transmits C/A information for multiple channels by interleaving the C/A information for the multiple channels on the same physical C/A bus over time. For example, in the embodiment illustrated in FIG. 3, the memory controller transmits C/A information for channel 0 on the rising edges of clock signal 302 (as illustrated by data 310), and transmits C/A information for channel 1 on the falling edges (as illustrated by data 312). Thus, the memory device(s) on channel 0 receive the C/A information 306 for channel 0 at the rising edges of clock signal 302, and the memory device(s) on channel 1 receive the C/A information 308 for channel 1 at the falling edges of clock signal 302.

Accordingly, in some embodiments with a shared C/A bus, the memory controller transmits C/A information at twice the rate as conventional memory subsystems. In conventional memory subsystems, the memory controller transmits C/A information on either the rising edge or the falling edge of the clock signal, but not both. In contrast, in embodiments, the memory controller transmits C/A information on both the rising and falling edges of the clock signal (similar to data buses running at a double data rate (DDR)). Transmission of the C/A information on both the rising and falling edges can enable transmission of C/A information at twice the rate of conventional systems. However, unlike a DDR data bus that is dedicated to a specific channel, in a memory subsystem with a DDR shared C/A bus, every clock edge triggers a C/A signal bit, but for different channels. Therefore, although multiple channels receive C/A information over a single shared C/A bus, the doubled rate of transmission of C/A information can compensate for or cancel out the performance impact of sharing the C/A bus, in accordance with embodiments.

In an embodiment in which the C/A bus is running at double the speed of a conventional C/A bus, the command UI is shorter than in a conventional system. For example, in a conventional system, the command UI is equal to two clock UIs, and in an embodiment with a double data rate shared C/A bus, the command UI is equal to one clock UI. Thus, in one embodiment, the memory devices or modules include I/O circuitry to accommodate the faster speed at which the shared C/A bus is run. For example, in one embodiment, the memory devices are configured with the knowledge that the shared C/A bus is running at a double data rate, and include I/O circuitry to obtain the C/A information on either the rising or falling clock edge within the shorter window of time. In another embodiment, the memory subsystem includes latches (e.g., on the memory modules) between the shared C/A bus and the memory devices that latch in the command address information from the shared C/A bus and hold the values for a longer period of time (e.g., two clock UIs). In one such embodiment, a memory subsystem with a shared C/A bus could include conventional memory devices that are not modified to accommodate the double data rate shared C/A bus.

In another embodiment, the memory controller time multiplexes the C/A information for multiple channels on the shared C/A bus, but transmits C/A information on either the rising or falling edges of the clock signal. In one such embodiment, transmitting the C/A information on only the rising or falling edges has the benefit of easing timing considerations (e.g., setup and hold time) on the shared C/A bus, but reduces the transmission rate of C/A information compared to when both rising and falling edges are used.

Figure 4A:
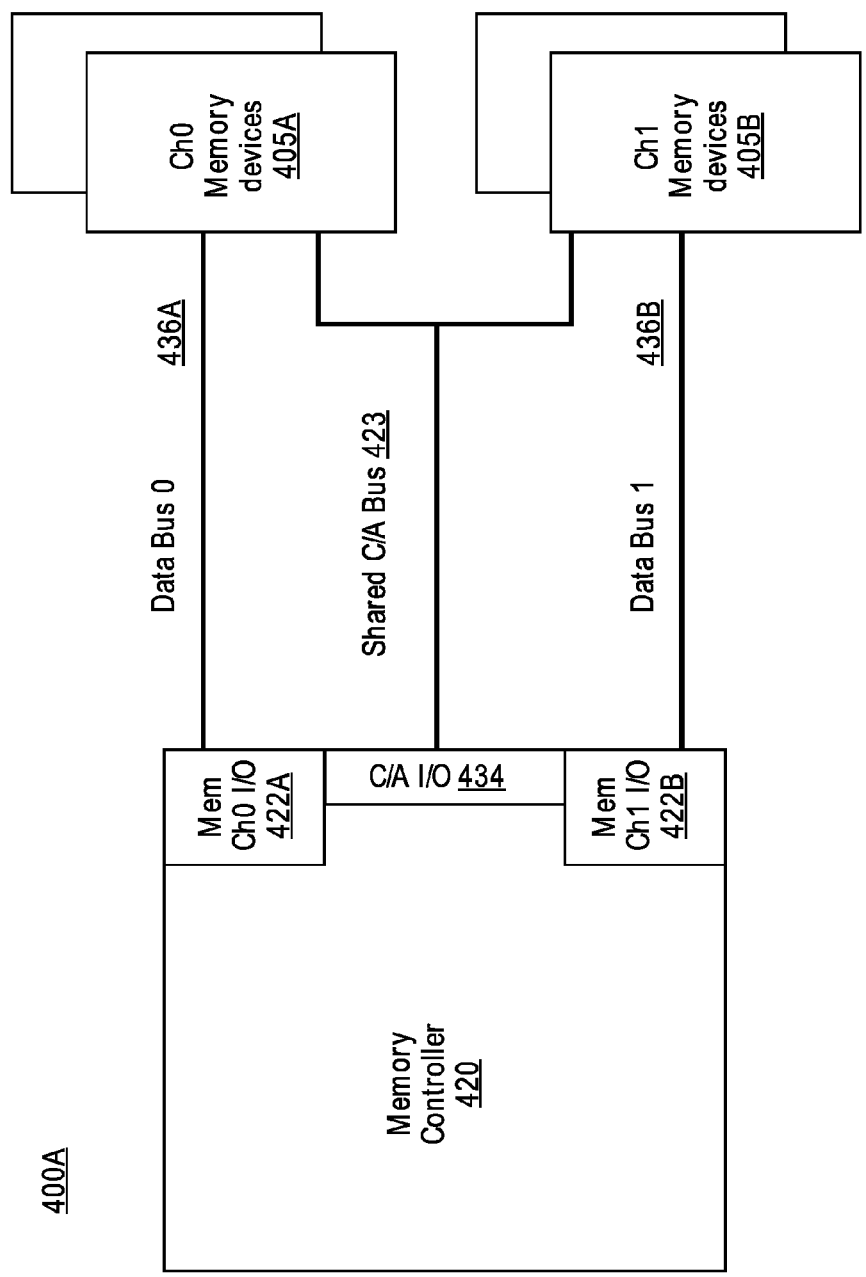
FIGS. 4A and 4B illustrate implementations of a memory subsystem with a shared C/A bus, in accordance with embodiments.
Figure 4B:
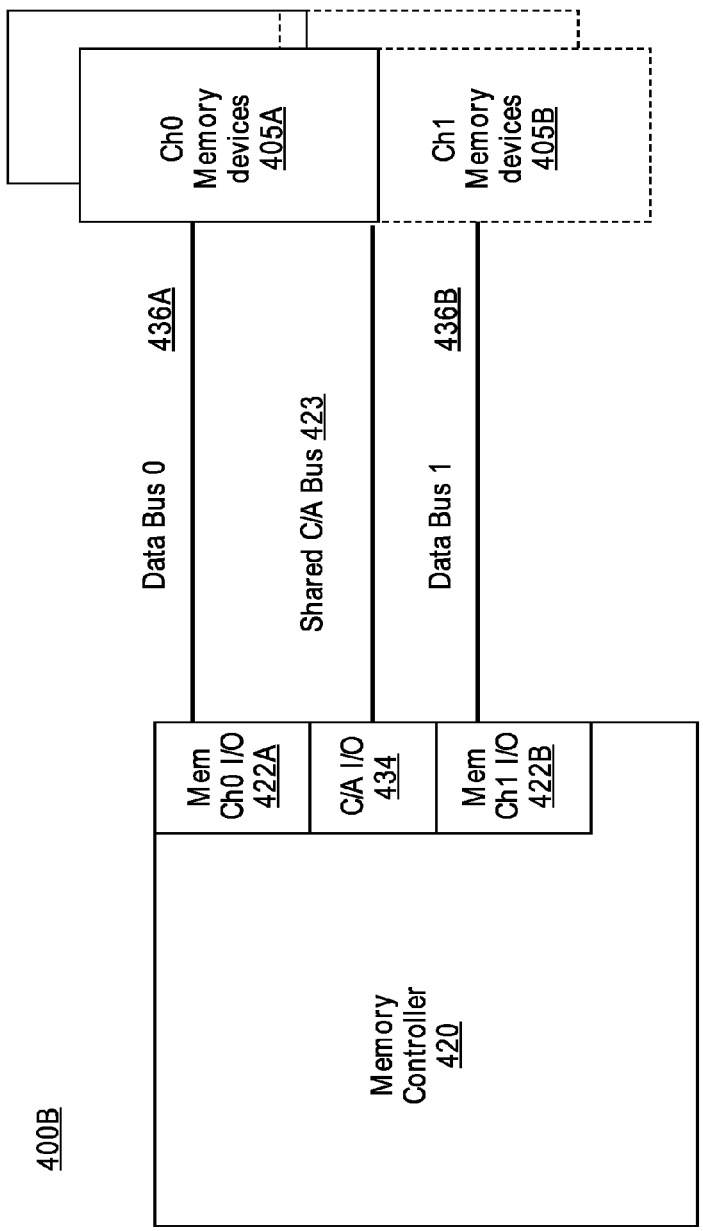

FIGS. 4A and 4B illustrate implementations of a memory subsystem with a shared C/A bus, in accordance with embodiments. FIG. 4A illustrates a memory subsystem with memory devices located on one side of the circuit board, in accordance with an embodiment. FIG. 4B illustrates a memory subsystem with memory devices located on both sides of the circuit board, in accordance with an embodiment.

Referring to FIG. 4A, the memory subsystem 400A includes a memory controller 420 coupled with memory devices 405A via I/O circuitry 422A for memory channel 0 and coupled with memory devices 405B via I/O circuitry 422B for memory channel 1. In the embodiment illustrated in FIG. 4A, channel 0 has a data bus 436A, and channel 1 has a separate data bus 436B. The I/O circuitry can be in accordance with the I/O circuitry 122A and 122B of FIGS. 1A and 1B. A shared C/A bus 423 couples the memory controller 420 with both the memory devices 405A on channel 0 and the memory devices 405B on channel 1. The memory controller 420 can send command and address information for both channel 0 and channel 1 over the same shared C/A bus 423 via I/O circuitry 434. For example, the memory controller can time multiplex command and address information on the shared C/A bus, as discussed above with respect to FIGS. 2B and 3. In the embodiment illustrated in FIG. 4A, the memory devices 405A and 405B for both channels are located on one side of a circuit board (e.g., one side of a motherboard, a substrate of a multi-chip module (MCM), or other circuit board). For example, the memory devices 405A and 405B can be mounted on a circuit board on the same side as the memory controller.

FIG. 4B illustrates another embodiment in which the memory devices are on both sides of the circuit board. Like the memory subsystem 400A of FIG. 4A, the memory subsystem 400B includes a memory controller coupled with memory devices 405A via memory channel 0 and coupled with memory devices 405B via memory channel 1. Also like the memory subsystem 400A, a shared C/A bus 423 couples the memory controller with the memory devices 405A and 405B. However, the memory subsystem 400B differs from the memory subsystem 400A in the placement of the memory devices. The memory devices 405A and 405B of FIG. 4B are located on opposite sides of the circuit board. For example, as illustrated in FIG. 4B, the memory devices 405A on channel 0 are located on the same side as the memory controller, and the memory devices 405B on channel 1 are located on the opposite side of the circuit board, as illustrated by the dotted lines. In accordance with embodiments, signal routing for the shared C/A bus differs in systems with memory devices on a single side of a circuit board and systems with memory devices on both sides of a circuit board. For example, a system with memory devices on both sides of a circuit board can employ vias to route C/A signal lines to memory devices on the opposite side of the circuit board, in accordance with embodiments. Additionally, the location of the I/O circuitry 422A, 422B, and 423 may vary based on whether the memory modules are located on a single side of the circuit board or on both sides.

Figure 5:
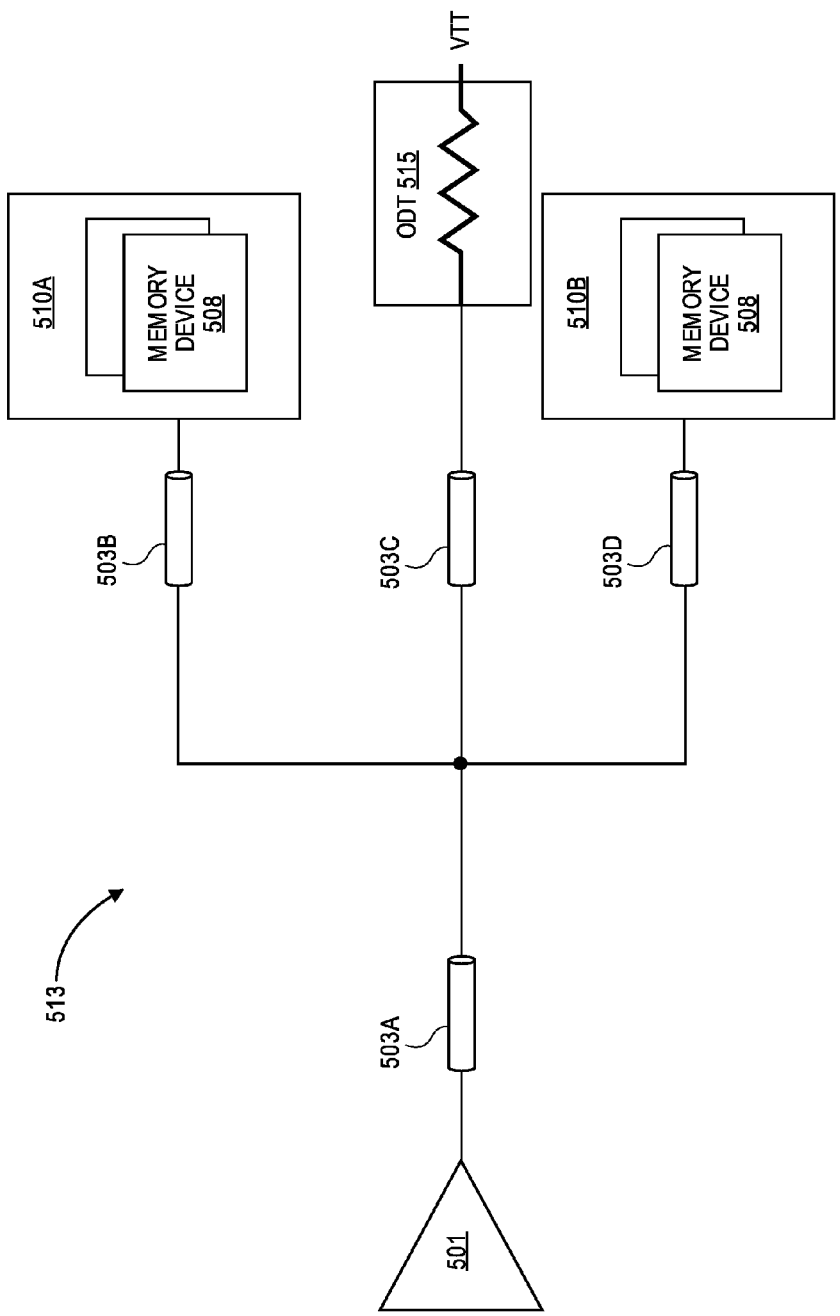
FIG. 5 illustrates a topology for a memory subsystem with a shared C/A bus, in accordance with embodiments.

FIG. 5 illustrates a topology for a memory subsystem with a shared C/A bus, in accordance with embodiments. More specifically, FIG. 5 illustrates the shared C/A bus 513 in a T-topology, in accordance with an embodiment. Input/output (I/O) 501, which can include command and address information from the memory controller, is transmitted on the C/A bus 513 via signal lines 503A-503D. The signal lines 503A branch out (e.g., via signal lines 503B and 503D) to groups 510A and 510B of memory devices 508 in a T-shaped configuration. The signal lines terminate (e.g., via signal line 503C) with on-die termination 515, in accordance with embodiments. The signal lines can include, for example, traces, wires connections, vias, or other signal lines or conductive features such as solder bumps or balls to form the interconnects of the shared C/A bus 513.

The groups 510A and 510B of memory devices 508 can include packages with multiple dies (e.g., dual die packages (DDPs)). The memory devices 508 can be the same as or similar to the memory devices 140A and 140B described above with respect to FIGS. 1A and 1B. For example, in one embodiment, the memory devices 508 are DRAMs. In the embodiment illustrated in FIG. 5A, the group 510A of memory devices 508 are configured to be on one channel (e.g., channel 0), and the group 510B of memory devices 508 are configured to be on a second channel (e.g., channel 1). The shared C/A bus 513 branches out (e.g., in a T-topology) to the memory devices 508 on both channel 0 and channel 1. Although a single group (e.g., a single DDP) of memory devices is illustrated on each channel, in other embodiments, each channel couples with multiple (e.g., 2) groups of memory devices.

Therefore, in accordance with an embodiment, a memory subsystem with a shared C/A bus can result in a reduction of pins and signal lines, which can enable reduction of board layer count and ease silicon, package, and board routing.

As mentioned above, further reduction of pin and signal lines can be achieved by reducing the number of strobe signal lines in a memory subsystem. For example, in one embodiment, pins and signal lines for strobe signals can also be reduced by running the strobe signal lines at double the speed of the data signal lines and using one strobe pair for two bytes of data on the data signal lines.

Figure 6:
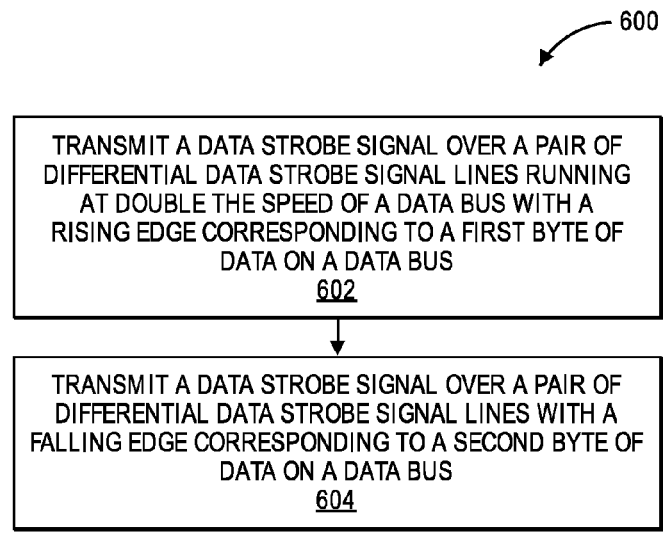
FIG. 6 is a flow diagram of a method of accessing memory devices using a double-speed data strobe, in accordance with an embodiment.

FIG. 6 is a flow diagram of a method of accessing memory devices using a double-speed data strobe, in accordance with an embodiment. The method 600 of FIG. 6 can be performed by one or more memory controllers, such as the memory controller 120 of FIGS. 1A and 1B. In conventional memory subsystems, data strobe signals (also referred to as strobe signals) are typically aligned with data signals and used to communicate when data on a corresponding data bus can be read. In some memory technologies, the strobe signal lines include pairs of differential strobe signal lines that are run at the same speed as the data signal lines. In one such example, for each byte of data signal lines, the memory subsystem includes one strobe pair (e.g., there is a 1:1 ratio between a byte of data signal lines and the strobe pairs).

In contrast, in one embodiment, a memory subsystem includes strobe signal lines that run at twice the speed of the data signal lines. In one such embodiment, one strobe pair (e.g., strobe signal lines 137A, 137B of FIGS. 1A and 1B) corresponds to two bytes of data signal lines (e.g., two bytes of the data signal lines 136A, 136B of FIGS. 1A and 1B). Thus, the memory devices can clock one byte on the rising edge of a given strobe signal, and clock the second byte on the falling edge of the strobe signal. Accordingly, in one such embodiment, the number of strobe signal lines can be reduced by half compared to conventional memory subsystems.

Referring to FIG. 6, the method 600 begins with the memory controller transmitting a data strobe signal over a pair of differential data strobe signal lines with a rising edge corresponding to a first byte of data on a data bus, at operation 602. The method also involves transmitting the data strobe signal with the falling edge corresponding to a second byte of data on the data bus, at operation 604. In one embodiment, in order to use one strobe pair for two bytes, the memory controller (e.g., the memory controller 120 of FIGS. 1A and 1B) adds a delay between the byte sets. For example, the I/O circuitry 122A, 122B of FIGS. 1A and 1B can include circuitry to add a delay (e.g., 1/2 clock UI) between the first byte and second byte sets on the data signal lines. Thus, the memory subsystem can use fewer strobe signal lines running at double speed.

Figure 7:
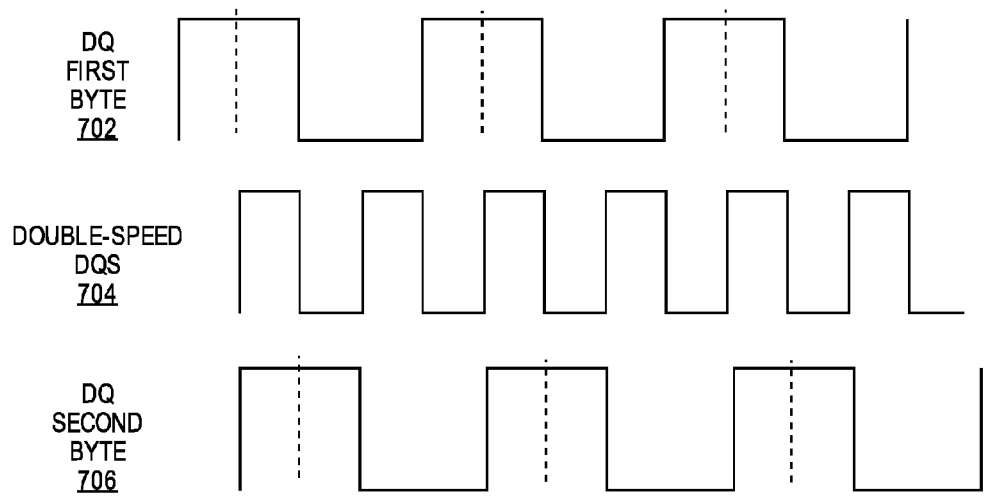
FIG. 7 is a timing diagram illustrating a double-speed data strobe, in accordance with an embodiment.

FIG. 7 is a timing diagram illustrating a double-speed data strobe, in accordance with an embodiment. FIG. 7 illustrates a double-speed (which can also be referred to as double-pumped) data strobe signal 704, in accordance with an embodiment. The strobe signal 704 is twice the speed of data signals 702, 706. The strobe signal 704 is used for two bytes of data, in accordance with an embodiment. For example, a first byte 702 is aligned with the rising edge of the double-speed strobe signal 704, and the second byte 706 is aligned with the falling edge of the strobe signal 704. As mentioned above with respect to FIG. 6, in one embodiment, the memory controller delays the second byte (e.g., the second byte 706) compared to the first byte (e.g., the first byte 702). Delaying the second byte compared to the first byte can keep the rising edge of the strobe signal within the first byte's eye (as illustrated by the dotted line) and keep the falling edge of the strobe signal within the second byte's eye (as illustrated by the dotted line). In another embodiment, the second byte 706 can be delayed using other techniques, such as lengthening the second byte's routing (e.g., by repositioning package pins and increasing the routing length of the second byte on the circuit board). Thus, a memory subsystem can use the double-speed strobe signal 704 for two bytes of data lines, enabling a reduction of strobe signal lines and pins, in accordance with an embodiment.

Figure 8:
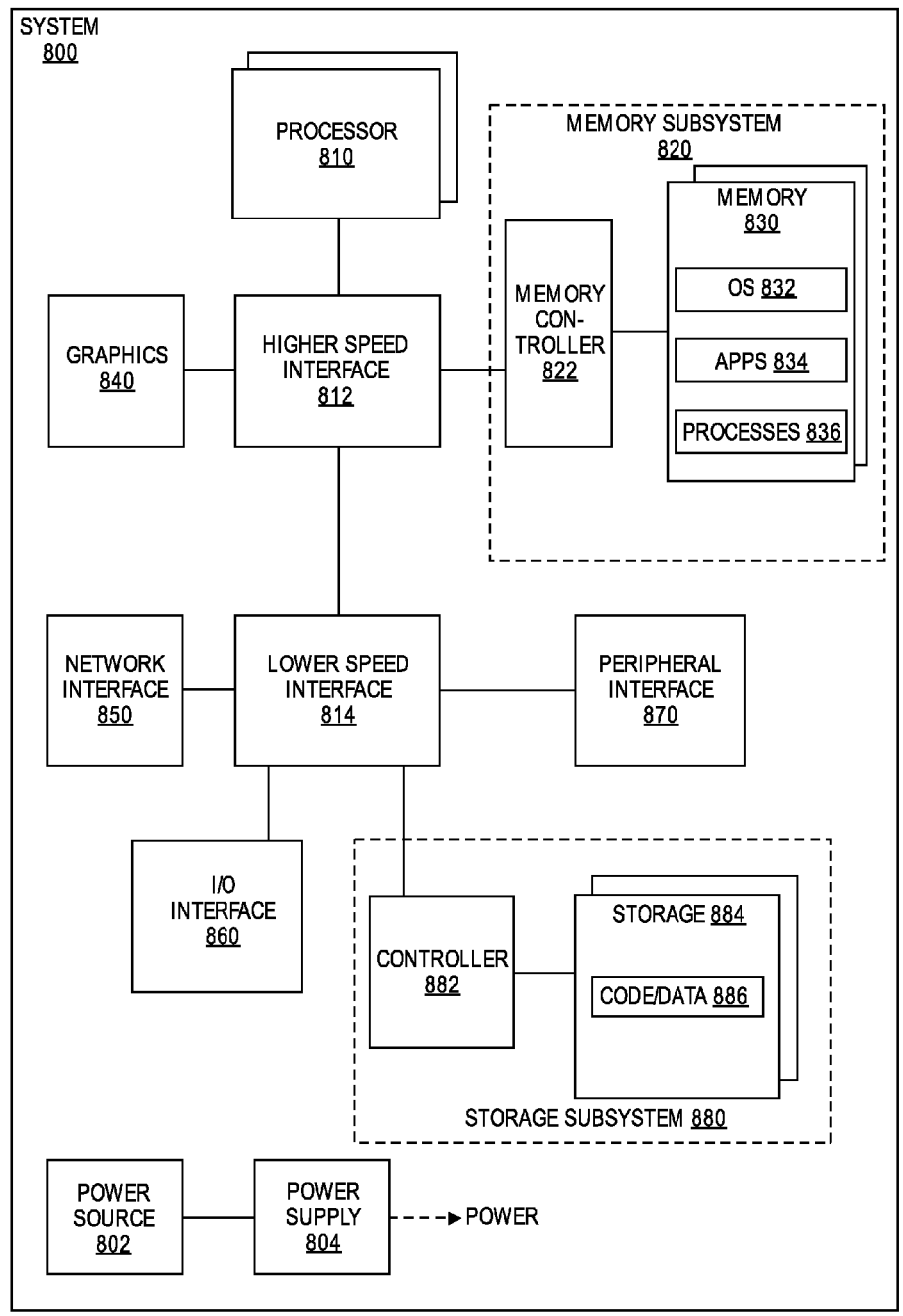
FIG. 8 is a block diagram of a computing system in which a shared C/A bus can be implemented, in accordance with an embodiment.

FIG. 8 is a block diagram of a computing system in which a shared C/A bus can be implemented, in accordance with an embodiment. System 800 represents a computing device in accordance with any embodiment described herein, and can be a laptop computer, a desktop computer, a server, a gaming or entertainment control system, a scanner, copier, printer, routing or switching device, embedded computing device, or other electronic device.

System 800 includes processor 810, which provides processing, operation management, and execution of instructions for system 800. Processor 810 can include any type of microprocessor, central processing unit (CPU), graphics processing unit (GPU), processing core, or other processing hardware to provide processing for system 800, or a combination of processors. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 800 includes interface 812 coupled to processor 810, which can represent a higher speed interface or a high throughput interface for system components that needs higher bandwidth connections, such as memory subsystem 820 or graphics interface components 840. Interface 812 can represent a "north bridge" circuit, which can be a standalone component or integrated onto a processor die. Graphics interface 840 interfaces to graphics components for providing a visual display to a user of system 800. In one embodiment, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more memory devices 830 such as read-only memory (ROM), flash memory, one or more varieties of random access memory (RAM), or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processor 836 represent agents or routines that provide auxiliary functions to OS 832 or one or more applications 834 or a combination. OS 832, applications 834, and processes 836 provide logic to provide functions for system 800. In one embodiment, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810. In accordance with embodiments, the memory controller 822 communicates with the memory devices 830 over data buses and command/address (C/A) buses. In one embodiment, the memory subsystem 820 includes a data bus for each channel, and a shared C/A bus for multiple channels. For example, the shared C/A bus can be the same as or similar to the shared C/A bus 134 of FIGS. 1A and 1B. In one embodiment, the memory subsystem 820 includes double-speed strobe signal lines, such as the double-speed strobe signal lines described above with respect to FIGS. 6 and 7. In one embodiment, the memory subsystem 820 has both a shared C/A bus and double-speed strobe signal lines.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 800 includes interface 814, which can be coupled to interface 812. Interface 814 can be a lower speed interface than interface 812. In one embodiment, interface 814 can be a "south bridge" circuit, which can include standalone components and integrated circuitry. In one embodiment, multiple user interface components or peripheral components, or both, couple to interface 814. Network interface 850 provides system 800 the ability to communicate with remote devices (e.g., servers, other computing devices) over one or more networks. Network interface 850 can include an Ethernet adapter, wireless interconnection components, USB (universal serial bus), or other wired or wireless standards-based or proprietary interfaces. Network interface 850 can exchange data with a remote device, which can include sending data stored in memory or receiving data to be stored in memory.

In one embodiment, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one embodiment, system 800 includes storage subsystem 880 to store data in a nonvolatile manner. In one embodiment, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one embodiment, storage subsystem 880 includes controller 882 to interface with storage 884. In one embodiment controller 882 is a physical part of interface 814 or processor 810, or can include circuits or logic in both processor 810 and interface 814.

Power source 802 provides power to the components of system 800. More specifically, power source 802 typically interfaces to one or multiple power supplies 804 in system 802 to provide power to the components of system 800. In one embodiment, power supply 804 includes an AC to DC (alternating current to direct current) adapter to plug into a wall outlet. Such AC power can be renewable energy (e.g., solar power) power source 802. In one embodiment, power source 802 includes a DC power source, such as an external AC to DC converter. In one embodiment, power source 802 or power supply 804 includes wireless charging hardware to charge via proximity to a charging field. In one embodiment, power source 802 can include an internal battery or fuel cell source.

Figure 9:
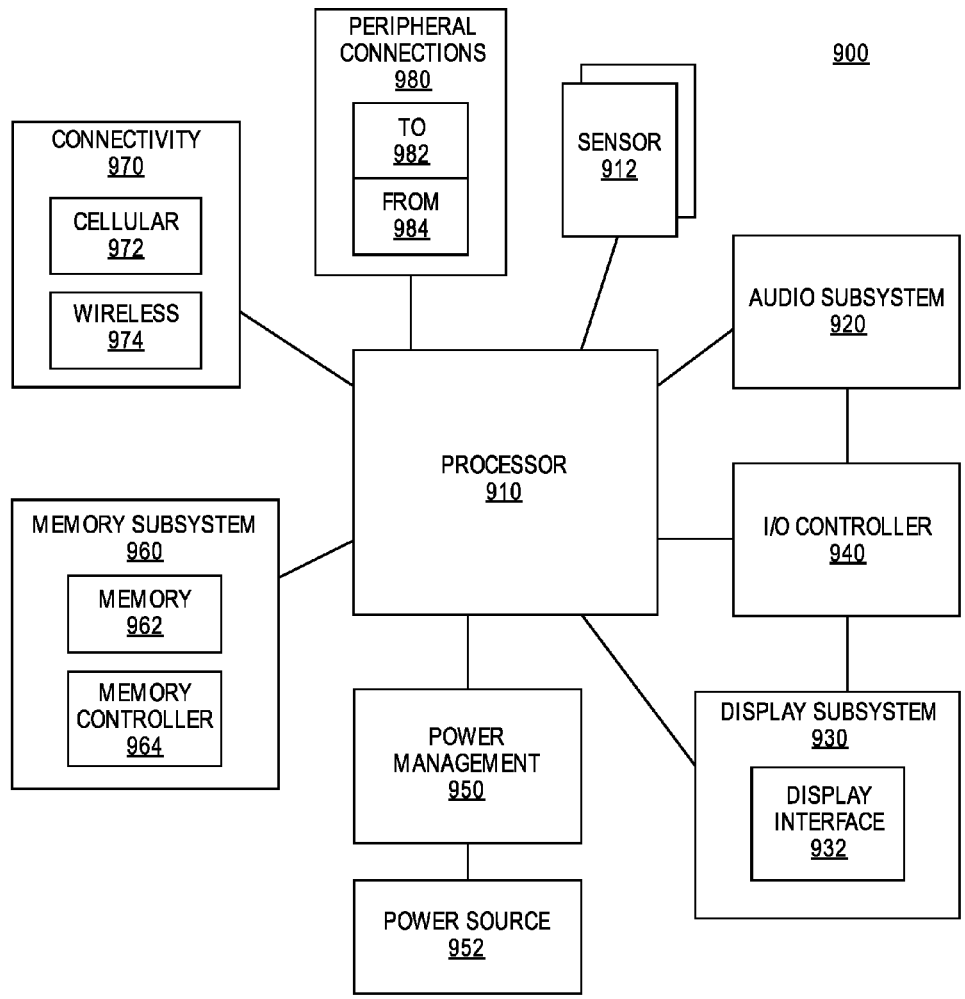
FIG. 9 is a block diagram of a mobile device in which a shared C/A bus can be implemented, in accordance with an embodiment.

FIG. 9 is a block diagram of an embodiment of a mobile device in which a shared C/A bus can be implemented. Device 900 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 900.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting device 900 to another device, or a combination. The processing operations can also include operations related to audio I/O, display I/O, or other interfacing, or a combination. Processor 910 can execute data stored in memory. Processor 910 can write or edit data stored in memory.

In one embodiment, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature, motion, light detection, or other sensors, or a combination. Sensors 912 should be understood broadly, and not limiting on the many different types of sensors that could be implemented with system 900. In one embodiment, one or more sensors 912 couples to processor 910 via a frontend circuit integrated with processor 910. In one embodiment, one or more sensors 912 couples to processor 910 via another component of system 900.

In one embodiment, device 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 900, or connected to device 900. In one embodiment, a user interacts with device 900 by providing audio commands that are received and processed by processor 910.

Display subsystem 930 represents hardware (e.g., display devices) and software components (e.g., drivers) that provide a visual display for presentation to a user. In one embodiment, the display includes tactile components or touchscreen elements for a user to interact with the computing device. Display subsystem 930 includes display interface 932, which includes the particular screen or hardware device used to provide a display to a user. In one embodiment, display interface 932 includes logic separate from processor 910 (such as a graphics processor) to perform at least some processing related to the display. In one embodiment, display subsystem 930 includes a touchscreen device that provides both output and input to a user. In one embodiment, display subsystem 930 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem 930 generates display information based on data stored in memory and operations executed by processor 910.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that can be included in device 900. The input can be part of direct user interaction, as well as providing environmental input to the system to influence its operations (such as filtering for noise, adjusting displays for brightness detection, applying a flash for a camera, or other features).

In one embodiment, device 900 includes power management 950 that manages battery power usage, charging of the battery, and features related to power saving operation. Power management 950 manages power from power source 952, which provides power to the components of system 900. In one embodiment, power source 952 includes an AC to DC (alternating current to direct current) adapter to plug into a wall outlet. Such AC power can be renewable energy (e.g., solar power, motion based power). In one embodiment, power source 952 includes only DC power, which can be provided by a DC power source, such as an external AC to DC converter. In one embodiment, power source 952 includes wireless charging hardware to charge via proximity to a charging field. In one embodiment, power source 952 can include an internal battery or fuel cell source.

Memory subsystem 960 includes memory device(s) 962 for storing information in device 900. Memory subsystem 960 can include nonvolatile (state does not change if power to the memory device is interrupted) or volatile (state is indeterminate if power to the memory device is interrupted) memory devices, or a combination. Memory 960 can store application data, user data, music, photos, documents, or other data, as well as system data (whether long-term or temporary) related to the execution of the applications and functions of system 900. In one embodiment, memory subsystem 960 includes memory controller 964 (which could also be considered part of the control of system 900, and could potentially be considered part of processor 910). Memory controller 964 includes a scheduler to generate and issue commands to memory device 962. In accordance with embodiments, the memory controller 964 communicates with the memory devices 962 over data buses and command/address (C/A) buses. In one embodiment, the memory subsystem 960 includes a data bus for each channel, and a shared C/A bus for multiple channels. For example, the shared C/A bus can be the same as or similar to the shared C/A bus 134 of FIGS. 1A and 1B. In one embodiment, the memory subsystem 960 includes double-speed strobe signal lines, such as the double-speed strobe signal lines described above with respect to FIGS. 6 and 7. In one embodiment, the memory subsystem 960 has both a shared C/A bus and double-speed strobe signal lines.

Connectivity 970 includes hardware devices (e.g., wireless or wired connectors and communication hardware, or a combination of wired and wireless hardware) and software components (e.g., drivers, protocol stacks) to enable device 900 to communicate with external devices. The external device could be separate devices, such as other computing devices, wireless access points or base stations, as well as peripherals such as headsets, printers, or other devices. In one embodiment, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading, uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

The following are embodiments of the disclosure. In one embodiment, a memory controller includes hardware logic to generate commands to access a plurality of memory devices via a plurality of channels, and input/output (I/O) circuitry to transmit command/address (C/A) information for the commands to the plurality of memory devices over a single C/A bus for the plurality of channels. In one embodiment, the I/O circuitry includes a multiplexer to multiplex the C/A information for the plurality of channels onto the single C/A bus. In one embodiment, the I/O circuitry is to transmit first C/A information for a first of the plurality of channels on a rising edge of a clock signal, and second C/A information for a second of the plurality of channels on a falling edge of the clock signal. In one embodiment, the single C/A bus includes a channel select bit, and the I/O circuitry is to transmit a value on the channel select bit of the single C/A bus to indicate which of the plurality of channels corresponding C/A information is for. In one embodiment, the single C/A bus is in a T-topology that branches to couple with at least a first memory device on a first memory channel and a second memory device on a second memory channel.

In one embodiment, the I/O circuitry is to further transmit and receive data over a plurality of data buses, wherein the plurality of data buses includes a separate data bus for each of the plurality of channels, and wherein the single C/A bus is to run at a same speed as the plurality of data buses. In one embodiment, the I/O circuitry is to transmit data strobe signals for the plurality of data buses over pairs of differential data strobe signal lines to run at a higher speed than the plurality of data buses. In one embodiment, the pairs of differential data strobe signal lines are to run at twice the speed of the plurality of data buses. In one embodiment, a given one of the pairs of differential data strobe signal lines corresponds to two bytes of a data bus. In one embodiment, a rising edge of a given data strobe signal corresponds to a first byte of data on a data bus, and a falling edge of the given data strobe signal corresponds to a second byte of data on the data bus.

In one embodiment, a system includes a processor and a memory controller communicatively coupled with the processor, wherein the memory controller is in accordance with any of the embodiments described above. In one embodiment, the system further includes any of a display communicatively coupled to the processor, a network interface communicatively coupled to the processor, or a battery coupled to provide power to the system.

In one embodiment, a memory device includes an array of memory cells and input/output (I/O) circuitry to receive command/address (C/A) information for a request to access the array of memory cells from a memory controller over a single C/A bus shared by a plurality of channels. In one embodiment, the C/A information is multiplexed for the plurality of channels onto the single C/A bus, and the I/O circuitry includes a demultiplexer to obtain the C/A information for a channel on which the memory device is on.

In one embodiment, the I/O circuitry is to receive C/A information on a rising edge of a clock signal, wherein a second memory device on a different channel is to receive second C/A information over the single C/A bus on a falling edge of the clock signal. In one embodiment, the single C/A bus includes a channel select bit, and the I/O circuitry is to receive a value on the channel select bit of the single C/A bus to indicate which of the plurality of channels corresponding C/A information is for. In one embodiment, the I/O circuitry is to further transmit and receive data over a data bus, wherein the single C/A bus is to run at a same speed as the data bus. In one embodiment, the I/O circuitry is to receive data strobe signals for the data bus over pairs of differential data strobe signal lines to run at a higher speed than the data bus. In one embodiment, the pairs of differential data strobe signal lines are to run at twice the speed of the data bus. In one embodiment, a given one of the pairs of differential data strobe signal lines corresponds to two bytes of the data bus. In one embodiment, a rising edge of a given data strobe signal corresponds to a first byte of data on the data bus, and a falling edge of the given data strobe signal corresponds to a second byte of data on the data bus.

In one embodiment, a method involves transmitting command/address (C/A) information over a shared C/A bus to a memory device on a first channel and transmitting second C/A information over the shared C/A bus to a second memory device on a second channel. In one such embodiment, transmitting the C/A information over the shared C/A bus involves multiplexing the C/A information for the plurality of channels onto the single C/A bus. In one embodiment, transmitting the C/A information and the second C/A information over the shared C/A bus involves transmitting the first C/A information for the first channel on a rising edge of a clock signal, and transmitting the second C/A information for the second channel on a falling edge of the clock signal. In one embodiment, the method further involves transmitting a value on a channel select bit of the single C/A bus to indicate which channel corresponding C/A information is for. In one embodiment, the method further involves transmitting and receiving data over a plurality of data buses, wherein the plurality of data buses includes a separate data bus for the first and second channels, and wherein the single C/A bus is to run at a same speed as the plurality of data buses. In one embodiment, the method involves transmitting data strobe signals for the plurality of data buses over pairs of differential data strobe signal lines to run at a higher speed than the plurality of data buses. In one embodiment, the pairs of differential data strobe signal lines are to run at twice the speed of the plurality of data buses. In one embodiment, a given one of the pairs of differential data strobe signal lines corresponds to two bytes of a data bus. In one such embodiment, a rising edge of a given data strobe signal corresponds to a first byte of data on a data bus, and a falling edge of the given data strobe signal corresponds to a second byte of data on the data bus.

In one embodiment, a method involves transmitting a data strobe signal over a pair of differential data strobe signal lines with a rising edge corresponding to a first byte of data on a data bus, and transmitting the data strobe signal over the pair of differential data strobe signal lines with a falling edge corresponding to a second byte of data on the data bus. In one such embodiment. In one embodiment, the pair of differential data strobe signal lines are to run at twice the speed of the data bus. In one embodiment, the pair of differential data strobe signal lines corresponds to two bytes of a data bus. Embodiments can include both a shared C/A bus and a double-speed strobe, or only one of a shared C/A bus or double-speed strobe.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:
1. A memory controller comprising:
hardware logic to generate commands to access a plurality of memory devices via a plurality of channels; and
input/output (I/O) circuitry to transmit command/address (C/A) information for the commands to the plurality of memory devices over a single C/A bus for the plurality of channels;
wherein the I/O circuitry is to further transmit and receive data over a plurality of data buses;
wherein the plurality of data buses includes a separate data bus for each of the plurality of channels; and wherein the I/O circuitry is to transmit data strobe signals for the plurality of data buses over pairs of differential data strobe signal lines to run at a higher speed than the plurality of data buses.

2. The memory controller of claim 1, wherein:
the I/O circuitry comprises a multiplexer to multiplex the C/A information for the plurality of channels onto the single C/A bus.

3. The memory controller of claim 1, wherein:
the I/O circuitry is to transmit first C/A information for a first of the plurality of channels on a rising edge of a clock signal, and second C/A information for a second of the plurality of channels on a falling edge of the clock signal.

4. The memory controller of claim 1, wherein:
one or more channel select bits are to indicate a channel for which corresponding C/A information on the single C/A bus is for, wherein a single channel select bit is to indicate a first or a second of the plurality of channels.

5. The memory controller of claim 1, wherein:
the single C/A bus is in a T-topology that branches to couple with at least a first memory device on a first memory channel and a second memory device on a second memory channel.

6. The memory controller of claim 1, wherein:
the single C/A bus is to run at a same speed as the plurality of data buses.

7. The memory controller of claim 1, wherein:
the pairs of differential data strobe signal lines are to run at twice the speed of the plurality of data buses.

8. The memory controller of claim 1, wherein:
a given one of the pairs of differential data strobe signal lines corresponds to two bytes of a data bus.

9. The memory controller of claim 1, wherein:
a rising edge of a given data strobe signal corresponds to a first byte of data on a data bus; and
a falling edge of the given data strobe signal corresponds to a second byte of data on the data bus.

10. A system comprising:
a processor; and
a memory controller communicatively coupled with the processor, wherein the memory controller comprises:
hardware logic to generate commands to access a plurality of memory devices via a plurality of channels; and
input/output (I/O) circuitry to transmit command/address (C/A) information to the plurality of memory devices over a single C/A bus for the plurality of channels;
wherein the I/O circuitry is to further transmit and receive data over a plurality of data buses;
wherein the plurality of data buses includes a separate data bus for each of the plurality of channels; and
wherein the I/O circuitry is to transmit data strobe signals for the plurality of data buses over pairs of differential data strobe signal lines to run at a higher speed than the plurality of data buses.

11. The system of claim 10, wherein:
the I/O circuitry comprises a multiplexer to multiplex the C/A information for the plurality of channels onto the single C/A bus.

12. The system of claim 10, wherein:
the I/O circuitry is to transmit first C/A information for a first of the plurality of channels on a rising edge of a clock signal, and second C/A information for a second of the plurality of channels on a falling edge of the clock signal.

13. The system of claim 10, wherein:
one or more channel select bits are to indicate a channel for which corresponding C/A information on the single C/A bus is for, wherein a single channel select bit is to indicate a first or a second of the plurality of channels.

14. The system of claim 10, wherein:
the I/O circuitry is to further receive data over a plurality of data buses;
wherein the plurality of data buses includes a separate data bus for each of the plurality of channels; and
wherein the single C/A bus is to run at a same speed as the plurality of data buses.

15. The system of claim 10, wherein:
the single C/A bus is in a T-topology that branches to couple with at least a first memory device on a first memory channel and a second memory device on a second memory channel.

16. The system of claim 10, wherein:
the single C/A bus is to run at a same speed as the plurality of data buses.

17. The system of claim 10, further comprising: any of a display communicatively coupled to the processor, a network interface communicatively coupled to the processor, or a battery coupled to provide power to the system.

18. A memory device comprising:
an array of memory cells; and
input/output (I/O) circuitry to receive command/address (C/A) information for a request to access the array of memory cells from a memory controller over a single C/A bus shared by a plurality of channels;
wherein the I/O circuitry is to further transmit and receive data over a data bus; and
wherein the I/O circuitry is to further receive data strobe signals for the data bus over pairs of differential data strobe signal lines to run at a higher speed than the data bus.

19. The memory device of claim 18, wherein:
the C/A information is multiplexed for the plurality of channels onto the single C/A bus; and
wherein the I/O circuitry comprises a demultiplexer to obtain the C/A information for a channel on which the memory device is on.

20. The memory controller of claim 4, wherein:
the single C/A bus includes the one or more channel select bits.

21. The system of claim 13, wherein:
the single C/A bus includes the one or more channel select bits.

* * * * *